United States Patent [19]

Ohta et al.

[11] Patent Number: 5,112,466

[45] Date of Patent: May 12, 1992

[54] APPARATUS FOR FORMING A THIN FILM

[75] Inventors: Wasaburo Ohta, Yokohama; Mikio Kinoshita, Kawasaki; Tadao Katsuragawa, Yamato, all of Japan

[73] Assignee: Ricoh Company, Ltd., Tokyo, Japan

[21] Appl. No.: 597,331

[22] Filed: Sep. 14, 1990

Related U.S. Application Data

[63] Continuation of Ser. No. 228,451, Aug. 5, 1988, Pat. No. 4,960,072.

[30] Foreign Application Priority Data

| Aug. 5, 1987 | [JP] | Japan | 62-196012 |
| Oct. 29, 1987 | [JP] | Japan | 62-274442 |
| Nov. 5, 1987 | [JP] | Japan | 62-169404 |

[51] Int. Cl.$^5$ ............................................. C23C 16/50
[52] U.S. Cl. ................................. 204/298.05; 118/723
[58] Field of Search .................... 204/192.31, 298.05, 204/298.14, 298.15; 118/723

[56] References Cited

U.S. PATENT DOCUMENTS

| 3,962,988 | 6/1976 | Murayama et al. | 204/192.31 X |
| 4,854,265 | 8/1989 | Ohta et al. | 204/298.05 X |
| 4,876,984 | 10/1989 | Kinoshita et al. | 204/298.05 X |
| 4,960,072 | 10/1990 | Ohta et al. | 204/298.05 X |
| 4,966,095 | 10/1990 | Ohta et al. | 204/298.05 X |
| 4,974,544 | 12/1990 | Ohta et al. | 204/298.05 X |
| 4,982,696 | 1/1991 | Kinoshita et al. | 204/298.05 X |

FOREIGN PATENT DOCUMENTS 0089763  5/1984  Japan ............................... 204/298.05

*Primary Examiner*—Nam Nguyen
*Attorney, Agent, or Firm*—Oblon, Spivak, McClelland, Maier & Neustadt

[57] ABSTRACT

An apparatus for forming a thin film having a vacuum container evacuated to high vacuum and receiving a gas for vapor deposition, a generation device for generating a material vapor, a counter electrode holding a substrate to be vapor-deposited, a first grid disposed between the generation device and the electrode for accelerating the vapor, and a filament for emitting thermions to ionize the vapor. The grid and counter electrode surfaces may be curved and parallel to each other, and a second grid for accelerating the vapor, having a potential which is negative with respect to the potential of the first grid, may be placed between the first grid and the electrode, in the vicinity of the electrode, and a device may be provided for moving the first grid with respect to the electrode on a predetermined track.

8 Claims, 4 Drawing Sheets

APPARATUS FOR FORMING A THIN FILM

This is a continuation of application Ser. No. 228,451, filed on Aug. 5, 1988, now U.S. Pat. No. 4,490,072.

BACKGROUND OF THE INVENTION

The present invention relates to an apparatus for forming a thin film which is suitable for forming a metal thin film or a semiconductor thin film which constitutes an IC, LSI or the like.

Various means for forming a thin film on a substrate have conventionally been proposed and various methods have been adopted therefor. CVD and PVD, for example, are typical of those methods.

CVD is advantageous in the strong reactivity, while PVD is advantageous in that it enables film formation in a high vacuum, thereby forming a dense and strong film. On the other hand, CVD disadvantageously requires the temperature of the substrate to be kept high, and the formation of a reactive thin film is difficult by PVD except for a part of the ion plating methods, as is well known to those skilled in the art.

An ion plating method is a method of ionizing and evaporating in vacuum the substance evaporated in an active gas or an inert gas by producing a high-frequency electromagnetic field between a source of evaporation and substances being evaporated. The ion plating method includes DC ion plating method in which a DC voltage is applied between the source of evaporation and the substances being evaporated. These ion plating methods are disclosed in, for example, Japanese Patent Publication No. 52-29971 (1977) and 52-29091 (1977).

Japanese Patent Application Laid-Open (KOKAI) No. 59-89763 (1984) filed by Applicant discloses an apparatus for depositing a thin film. This apparatus is provided with a counter electrode for holding a substrate for deposition, and a grid disposed between the counter electrode and a source of evaporation which opposes the counter electrode in such a manner that the grid is impressed with a positive potential relative to the counter electrode. A filament for thermionic emission is disposed between the grid and the source of evaporation. This structure enables the substances evaporated from the source of evaporation to be ionized by the thermions emitted from the filament. The ionized substances which pass through the grid are accelerated by the effect of an electric field directed from the grid to the counter electrode and impinge on the substrate, thereby forming a thin film having a good adhesion on the substrate.

There are many other methods of and apparatuses for forming a thin film. However, the conventional methods of forming a thin film, have some problems.

A first problem is that the adhesion between the thin film formed and the substrate is weak.

A second problem is that it is difficult to form a thin film on a substrate having a low heat resistance.

A third problem is that if a material having a low electric conductivity and having a large area such as a plastic film and a disk is used as a substrate for deposition, there is difference in physical properties of the thin film formed such as the thickness and the electrical resistance between the central portion and the peripheral portion of the substrate.

In a conventional apparatus for forming a thin film having the third problem, the reason why the thin film formed produces difference in physical properties such as the thickness and the resistance between the central portion and the peripheral portion of the substrate for deposition is as follows:

The surface of the counter electrode has an equal potential at all points and the electric field is orthogonal to the surface. However, when the substrate for deposition which is thick to a certain extent and inferior in the electric conductivity is held by the counter electrode, the electric field on the surface of the substrate is not always orthogonal to the surface of the substrate, so that the states of the electric field are not the same between the central portion and the peripheral portion of the substrate.

The nature of the plasma generated at the central portion of the substrate is therefore different from that generated at the peripheral portion of the substrate, which fact leads to the difference in the physical properties of the thin film formed such as the thickness and the resistance between the central portion and the peripheral portion of the substrate for deposition. Especially, in the case of the method disclosed in Japanese Patent Application Laid-Open (KOKAI) No. 59-89763 (1984), when the pressure of the gas introduced at the time of film formation is low or when the distance between the grid and the substrate is short, the evaporated particles reach the substrate while the dispersion of the particles due to the ambient gas or ions is insufficient, so that the film thickness is insufficient at the portion at which the material constituting the grid shields the evaporated particles.

SUMMARY OF THE INVENTION

Accordingly, it is a first object of the present invention to provide an apparatus for forming a thin film which is capable of forming a thin film having a strong adhesion on a substrate and which is capable of using a material having a low heat resistance such as a plastic sheet for the substrate.

It is a second object of the present invention to provide an apparatus for forming a thin film which is capable of forming a thin film having a strong adhesion on a substrate and excellent uniformity and which is capable of using a material having a low heat resistance such as a plastic sheet for the substrate.

According to the present invention, the first object can be achieved by the first apparatus, that is, an apparatus for forming a thin film comprising;

a vacuum container evacuated to high vacuum and receiving a gas for vapor deposition therein, generation means for generating a vapor of a material for vapor deposition and introducing said vapor into said container, a counter electrode disposed within said container and holding a substrate to be vapor-deposited on a holding surface thereof, said holding surface opposing said generation means with a substantially equal distance from said generation means at all points thereof, an electrical potential of said electrode being to be set equal or negative relatively to an electrical potential of said generation means, said holding surface being adapted to have a parallel curved surface, a grid disposed between said generation means and said electrode for allowing said vapor to pass therethrough and accelerating said vapor, a surface of said grid being adapted to have an equal distance from said holding surface, an electrical potential of said grid being set positive relatively to said potential of said generation means, said grid being adapted to have a parallel curved surface, and a filament disposed between said generation means and said grid for emitting thermions to ionize said vapor.

According to the first apparatus, electric fields directed in the opposite directions, namely, an electric field directed from the grid to the substrate and an electric field directed from the grid to the generation means are formed in the vacuum container. Since the surface of the grid with a parallel curved surface has a configuration having an equal distance from the holding surface with a parallel curved surface at all points, the electric field directed from the grid to the substrate is generated substantially perpendicularly to the holding surface. Preferably the parallel curved surface is a concentric sphere surface.

A part of the vapor from the generation means is ionized to cations by the thermions emitted from the filament. The vapor partially ionized in this way passes through the grid and the ionization of the vapor to cations is further accelerated by ionized gas. The effect of the electric field accelerates the speed of the cations to be impinged onto the substrate.

Since the ionization of the vapor generated from the generation means is effected in a very high state by the thermions from the filament and the electric fields in the vicinity of the grids, a very stable plasma state is realized. At this time, since the electric field directed from the grid to the substrate is generated substantially perpendicularly to the holding surface, and the vapor has charges, the course of the cations is changed by the electric field in such a manner as to be along the electric field.

Consequently according to the first apparatus, the ionized vapor proceeds in the direction of the electric field and impinges onto the substrate substantially perpendicularly thereto at an accelerated speed, so that a thin film which is excellent in the adhesion, the surface smoothness and crystallizability is formed on the substrate.

Further, according to the first apparatus since the thermions from the filament are emitted in the state in which the thermions have a kinetic energy which corresponds to the temperature of the filament, they are not immediately absorbed by the grid having a positive potential but first pass through the grid. Thereafter, they are brought back to the grid by the Coulomb attraction, and pass through the grid again. In this way, the vibrating motion is repeated around the grid, until the thermions are absorbed by the grid, so that they do not reach the substrate. The substrate is therefore not shocked by the thermions and, hence, not heated thereby. Thus, it is possible to prevent the rise in the temperature of the substrate, while the vapor has a very high energy due to the high ionization. Consequently according to the first apparatus, it is possible to form a thin film at a low temperature without adding a heat energy to the substrate, thereby enabling even a plastic sheet or the like which is inferior in the heat resistance to be used as the substrate.

According to the present invention, the second object can be achieved by the second apparatus, that is, an apparatus for forming a thin film comprising;

a vacuum container evacuated to high vacuum and receiving a gas for vapor deposition therein, generation means for generating a vapor of a material for vapor deposition and introducing said vapor into said container, a counter electrode disposed within said container and holding a substrate to be vapor-deposited such that said substrate opposes said generation means, a first grid disposed between said generation means and said electrode for allowing said vapor to pass therethrough and accelerating said vapor, an electrical potential of said first grid set positive relatively to an electrical potential of said electrode, a second grid disposed between said first grid and said electrode within a vicinity of said electrode for allowing said vapor to pass therethrough and accelerating said vapor, an electrical potential of said second grid being set negative relatively to said potential of said first grid, and a filament disposed between said first grid and said generation means for emitting thermions to ionize said vapor.

According to the second apparatus, the ionization of the vapor from generation means is effected in a very high state by the thermions from the filament, so that a thin film which is excellent in the adhesion, the surface smoothness and crystallizability is formed on the substrate. In this case, since the vapor has a very high energy due to the high ionization, it is possible to form a thin film at a low temperature without adding a heat energy, thereby enabling even a plastic sheet or the like which is inferior in the heat resistance to be used as the substrate as in the case of the first apparatus.

In addition according to the second apparatus, there is provided a second grid disposed in close proximity to the counter electrode. That is, the second grid is in close proximity to the surface of the substrate which is held by the counter electrode.

By the effect of the second grid, very uniform plasma is realized in the vicinity of the substrate. In addition, the vapor is uniformly shielded by the second grid when it is impinged onto the substrate. It is therefore possible to form a uniform thin film even if the substrate is thick to a certain extent, insufficient in the electric conductivity and has a large area.

Consequently according to the second apparatus, it is possible to form a uniform thin film even on a substrate for deposition having a large area, wherein the uniform thin film has a strong adhesion on the substrate and is capable of using a material having a low heat resistance such as a plastic sheet for the substrate.

According to the present invention, the second object can be also achieved by the third apparatus, that is, an apparatus for forming a thin film comprising;

a vacuum container evacuated to high vacuum and receiving a gas for vapor deposition therein, generation means for generating a vapor of a material for vapor deposition and introducing said vapor into said container, a counter electrode disposed within said container and holding a substrate to be vapor-deposited such that said substrate opposes said generation means, a grid disposed between said generation means and said electrode for allowing said vapor to pass therethrough and accelerating said vapor, an electrical potential of said grid being to be set positive relatively to an electrical potential of said electrode, a filament disposed between said grid and said generation means for emitting thermions to ionize said vapor, and moving means for moving said grid with respect to said electrode on a predetermined track.

According to the third apparatus, the ionization of the vapor from generation means is effected in a very high state by the thermions from the filament, so that a thin film which is excellent in the adhesion, the surface smoothness and crystallizability is formed on the substrate. In this case, since the vapor has a very high energy due to the high ionization, it is possible to form a thin film at a low temperature without adding a heat energy, thereby enabling even a plastic sheet or the like which is inferior in the heat resistance to be used as the substrate as in the case of the first or the second apparatus. In addition according to the third apparatus, since moving means which moves the grid on a predetermined track relative to the counter electrode is provided, the geometrical pattern drawn by the grid produces the effect of shading the substances uniformly at each portion of the substrate during the formation of a thin film, thereby decreasing the unevenness in the film thickness.

Consequently according to the third apparatus, it is possible to form a uniform thin film even on a substrate for deposition having a large area, wherein the uniform thin film has a strong adhesion on the substrate and is capable of using a material having a low heat resistance such as a plastic sheet for the substrate.

As for the gas for vapor deposition according to the present invention, an active gas, an inert gas or a mixture of the active gas and the inert gas may be used in any one of the apparatuses according to the present invention.

As for the generation means according to the present invention, the generation means may comprise a source of evaporation of either a resistance heating type or an electron beam type for evaporating a substance, alternatively the generation means may comprise an evaporation injector for injecting an evaporated substance in any one of the apparatuses according to the present invention.

As for the grid and the holding surface according to the first apparatus, the grid and the holding surface may be so formed as to have a concentric sphere or a parallel curved surface.

DESCRIPTION OF THE PREFERRED EMBODIMENTS

Figure 1:
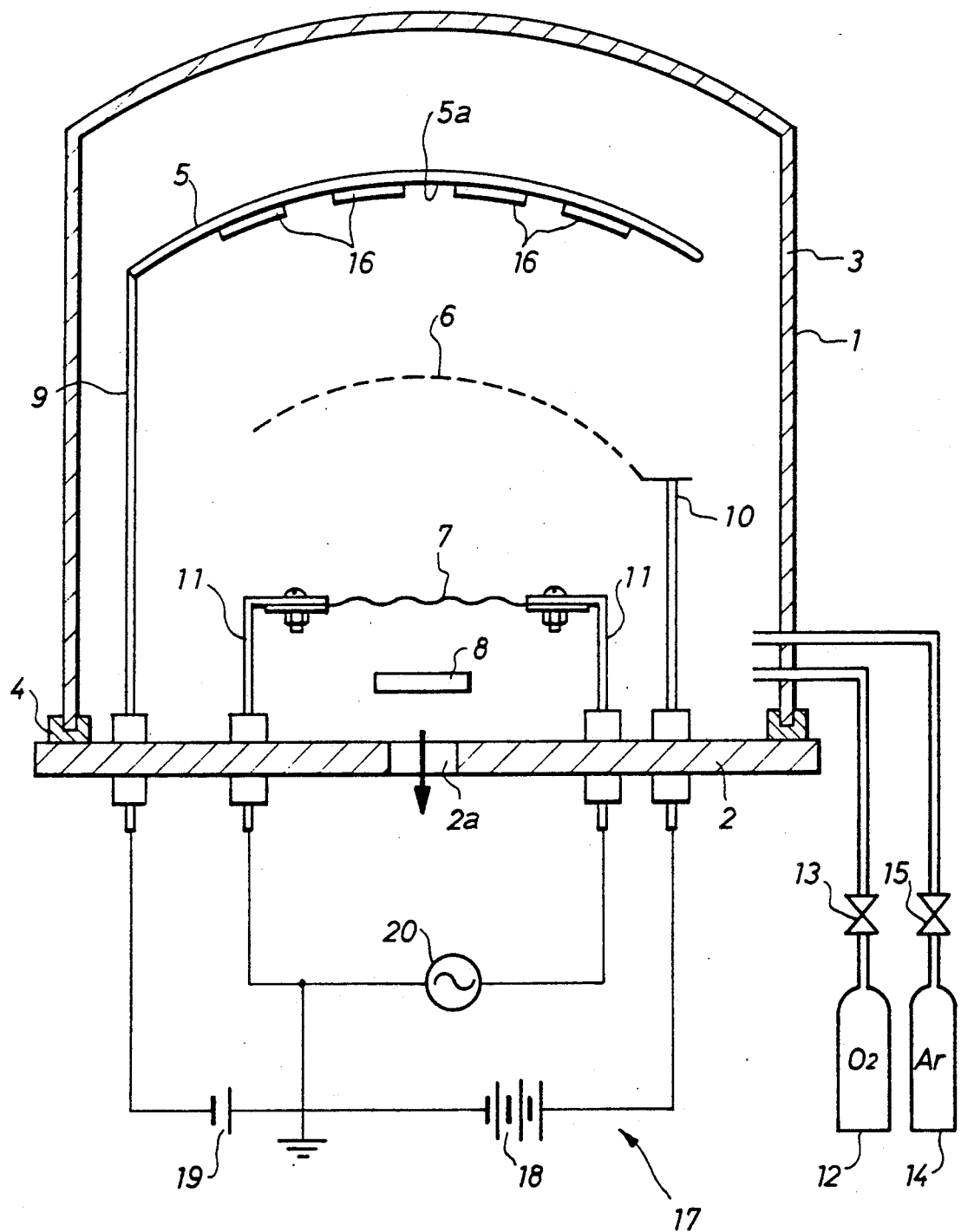
FIG. 1 is a schematic view of a first embodiment of the present invention.

A first embodiment of the present invention will be explained hereinunder with reference to FIG. 1. In FIG. 1, there is a vacuum container 1. The vacuum container 1 is composed of a base plate 2 and a bell jar 3 integrally provided on the base plate 2 through a packing 4. The base plate 2 has a hole 2a at the central portion thereof and is connected to an evacuation system (not shown) via the hole 2a in an airtight relationship.

In the container 1, a counter electrode 5, a grid 6, a filament 7 and a generation portion 8 for generating a vapor of a material for vapor deposition are disposed with an appropriate space therebetween in that order from the top to the bottom. These members 5, 6 and 7 are supported by the electrodes 9, 10 and 11, respectively, which also serve as the supporters. These electrodes 9 to 11 extend to the outside of the container 1 through the base plate 2 while being kept electrically insulated from the base plate 2. These electrodes 9 to 11 electrically connect and feed the members inside and outside of the container 1 and can constitute the electrically conducting means together with other wiring means. Airtightness is secured at the portions through which the electrodes 9 to 11 extend to the outside of the container 1.

The generation portion 8 may be a source of evaporation which is used in ordinary vacuum evaporation, namely, a source of evaporation of a resistance heating type or a source of evaporation of an electron beam type. Alternatively, an evaporation injector made of a stainless steel pipe with one end formed into a nozzle may be used for evaporating a vapor of a material for vapor deposition. In the case of using such a nozzle system, the other end of the steel pipe is connected to a bomb (not shown) which accommodates a material of a thin film, or a plurality of bombs (not shown) through a gas mixer depending upon the composition of a thin film to be formed. The generation portion 8 is connected to a terminal having a negative potential relative to the potential of the grid 6. The generation portion 8 introduces the material of the thin film in the form of vapor (gas) or spray.

To the vacuum container 1, a bomb 12 accommodating an active gas such as $O_2$ is connected through a valve 13, and a bomb 14 accommodating an inert gas such as Ar is connected through a valve 15.

The counter electrode 5 supported by the electrode 9 has an undersurface which serves as a holding surface 5a. The holding surface 5a is so designed as to have a substantially equal distance from the generation portion 8 at all points thereof. For example, the holding surface 5a is a sphere or a parallel curved surface. On the holding surface 5a having such a configuration, a substrate 16 on which a thin film is formed is held by an appropriate means in the state of opposing the generation portion 8.

The filament 7 supported by the pair of electrodes 11 generates thermions which are used for the ionization of a part of the material vapor, and is made of tungsten or the like. The filament 7 is composed of, for example, a plurality of filaments arranged in parallel or reticulately, and is so adapted as to cover the spread of the vapor discharged from the generation portion 8.

The grid 6 supported by the electrode 10 has a structure having spaces which allow the vapor to pass therethrough. For example, the grid 6 has a reticulate configuration. The surface of the grid 6 is so formed as to have an equal distance from the holding surface 5a at all points. For example, the grid 6 is so formed as to have a concentric sphere or a parallel curved surface. In this embodiment, the grid 6 has a structure of reticulate and a surface shape of a concentric sphere corresponding to the surface holding surface 5a.

A power source means 17 for establishing a predetermined potential relationship between the counter electrode 5, the grid 6, the filament 7, and the generation portion 8 is provided outside the container 1 and connected to each member through the electrodes 9 to 11. DC power sources 18 and 19 are provided, and the positive electrode of the DC power source 18 is connected to the grid 6 via the electrode 10 and its negative electrode is grounded, while the positive electrode of the DC power source 19 is grounded and the negative electrode thereof is connected to the counter electrode 5 via the electrode 9. The grid 6 has a positive potential relative to the potentials of the counter electrode 5 and the generation portion 8. Therefore, electric fields directed in the opposite directions, namely, an electric field directed from the grid 6 to the counter electrode 5 and an electric field directed from the grid 6 to the generation portion 8 are generated in a container 1. The filament 7 is connected to both ends of an AC power source 20 via the pair of electrodes 11. In place of the AC power source 20, a DC power source may be used. These power sources 18, 19 and 20 constitute the power source means 17, but the grounding shown in FIG. 1 is not necessarily required.

Actually, the power source means 17 includes various switches for effecting electrical connections and by operating these switches the film forming process is executed, but these switches are omitted here.

A method of forming a thin film using this embodiment will now be explained.

The substrate 16 is first set and supported by the counter electrode 5, as shown in FIG. 1. The container 1 has been evacuated in advance to $10^{-5}$ to $10^{-6}$ Torr and an active gas, an inert gas or a mixture of an active gas and an inert gas is introduced thereinto, depending on cases, at a pressure of $10^{-2}$ to $10^{-5}$ Torr. For clarity of explanation, it is assumed here that the introduced gas is an inert gas such as argon.

If the power source means 17 is operated in this state, a positive potential is applied to the grid 6, a negative potential is applied to the counter electrode 5, and a current flows on the filament 7. The filament 7 is heated by the self resistance heat and emits thermions. The argon molecules within the container 1 collide with the thermions emitted from the filament 7 and the electrons in the outer shell of the argon molecules are fillipped out, thereby the argon molecules are ionized to cations.

In this state, the vapor is introduced from the generation portion 8 to the container 1 and a part of the activated vapor is ionized to cations by the ionized argon or the thermions. The vapor a part of which has been ionized in this way passes through the grid 6. At this time, the ionization of the vapor is further accelerated by the thermions which keep on the vertical vibrating movement in the vicinity of the grid 6 and the collision with the ionized argon gas introduced. Since the thermions from the filament 7 are emitted with a kinetic energy which corresponds to the temperature of the filament 7, they are not immediately absorbed by the grid 6 having a positive potential but first pass through the grid 6. Thereafter, they are brought back to the grid 6 by the Coulomb attraction, and pass through the grid 6 again. In this way, the vibrating motion of the thermions is repeated around the grid 6.

The part of the vapor which has passed through the grid 6 and has not yet been ionized is ionized to cations by the collision with the ionized argon gas introduced between the grid 6 and the substrate 16, thereby enhancing the ionization ratio.

The vapor ionized to cations in this way is accelerated toward the substrate 16 by the effect of the electric field directed from the grid 6 to the counter electrode 5, and impinges and adheres onto the substrate 16 with a high energy. Thus, a thin film having good adhesion is formed on the substrate 16. In this embodiment, since the surface of the grid 6 is so formed as to have an equal distance from the substrate holding surface 5a at all points, for example, the grid 6 is so formed as to have a concentric sphere, the electric field directed toward the counter electrode 5 is generated substantially perpendicularly to the substrate holding surface 5a. The vapor which has been ionized to cations also hit the substrate 16 substantially perpendicularly to the substrate 16 in correspondence with the direction of the electric field, thereby forming a good thin film.

On the other hand, most of the thermions emitted from the filament 7 are finally absorbed by the grid 6 and only a part of them pass therethrough. The few thermions which have passed through the grid 6 are decelerated between the grid 6 and the substrate 16 by the effect of the electric field, so that almost no thermion reaches the substrate 16. Even if some of them reach the substrate 16, they do not provide the substrate 16 with electron impact, thereby enabling the prevention of the rise in the temperature of the substrate 16, thereby enabling a material having a low heat resistance such as a plastic material to be used for the substrate 16.

As described above, according to the first embodiment, since the ionization ratio of the vapor is very high, it is easy to form a thin film having desired physical properties even in a case that an active gas is introduced into the container 1 singly or together with an inert gas and that the vapor and the active gas are combined with each other so as to form a thin film of the reaction compound. For example, if argon and oxygen are selected as the inert gas and the active gas, respectively, while the pressure in the container 1 is adjusted to $10^{-4}$ Torr, and a metal such as zinc, aluminum, tin, indium and other oxidizable metals is evaporated from the generation portion 8, a thin film of an oxide of such a metal, for example, zinc oxide, aluminum oxide, tin oxide and indium oxide is formed on the substrate 16. Similarly, if a metal such as titanium, chromium and iron is evaporated and an active gas such as nitrogen and ammonia are introduced, a thin film of a metal nitride, namely, titanium nitride, chromium nitride, iron nitride or the like is formed on the substrate 16. Furthermore, if argon is introduced as the inert gas and gaseous $SiH_4$ is used as the vapor or Si or SiO is selected as the substance being evaporated, a thin film of $SiO_2$ is formed on the substrate 16. If $H_2S$ and Cd are selected as the gas and the substance being evaporated, respectively, a thin film of CdS is obtained. If ammonia is used as an active gas together with argon, and Ti or Ta is selected as the substance being evaporated, a thin film of TiN or TaN can be obtained.

The vapor is selected in accordance with the composition of a thin film to be formed. For example, when a silicon thin film is formed, $SiH_4$, $SiCl_4 + 2H_2$ or the like is used. When a thin film of $SiO_2$ is formed, $SiH_4 + O_2$ is introduced as the vapor. For forming a carbon thin film, almost all organic matters containing carbon are usable. For example, alcohols, benzenes, an aqueous solution of alcohol, and organic gases such as methane gas are usable. At the time of the formation of a metal thin film, metal halides (e.g., $CuCl_4$ for the formation of a Cu thin film and $AlCl_3$ for the formation of an Al thin film) or metal salts (e.g., $Al(CH_2-CH).(CH_3)_2$ for the formation of an Al thin film and $NiCO_4$ for the formation of an Ni thin film) are usable. When a thin film of an alloy is formed, a mixed gas of chlorides of the corresponding metal components is used. For the formation of a thin film of gallium arsenide, a mixed gas of $(CH_3)_3 + AsH_3$ is used. Gases consisting of other components, compounds or elements enable the film formation in the same manner.

Since the thermions from the filament 7 effectively contribute to the ionization of the vapor in the container 1, the ionization of the material vapor is possible even in a high vacuum of not more than $10^{-4}$ Torr. It is therefore possible to provide a thin film having a very dense structure. Although it is generally said that the density of a thin film is lower than that of the bulk, a thin film having a density very close to that of the bulk is provided according to the first embodiment. Furthermore, according to the first embodiment, since film formation in a high vacuum is possible, only a few gas molecules are taken into the thin film formed, thereby forming a thin film of high purity. Therefore, an apparatus for forming a thin film according to the first embodiment is very suitable for the formation of semiconductor thin films constituting LSI and IC, etc. and metal thin films of high purity which are used as the electrodes thereof.

In short, an apparatus according to the first embodiment is a completely new apparatus which can realize both the merit of CVD and the merit of PVD, the former being that it is possible to provide a thin film with strong reactivity and the latter being that film formation is executed in a high vacuum which enables the formation of a dense and strong thin film. Since the vapor is ionized and has electrically high energy (the temperatures of electrons and ions), it is possible to realize the film formation which require reactivity and crystallization without providing heat energy in the form of temperature (reaction temperature and crystallizaton temperature), thereby enabling film formation at a low temperature. A plastic sheet or the like having a low heat resistance may therefore be used as the substrate 16. In addition it is possible to form a thin film excellent in the physical properties such as electrical characteristics, optical characteristics, crystallizability, density and adhesion with the substrate.

If a high-frequency electrode which produces a high-frequency electromagnetic field is disposed between the grid 6 and the counter electrode 5, the ionization of the vapor is further accelerated by the high-frequency electromagnetic field, thereby enhancing the above-described various effects.

A second embodiment of the present invention will be explained in the following with reference to FIG. 2. The same reference numerals are provided for the elements that are the same as those in the first embodiment, and explanation thereof will be omitted.

In the container 1, electrodes 9, 11, 111, 112 and 113, which also serve as supporters, are provided. The electrodes 9, 11, 111, 112 and 113 extend to the outside of the container 1 through the base plate 2 in an airtight relationship with the interior of the container 1 while being kept electrically insulated from the base plate 2. These electrodes 9, 11, 111, 112 and 113 constitute the electrically conducting means together with other wiring means, power sources, etc.

A counter electrode 105 is disposed at the end portion of the electrode 9 in a fixed state.

The electrode 112 is provided with a first grid 106a and the electrode 113 is provided with a second grid 106b.

The filament 7 is held by the pair of electrodes 11. A source of evaporation 108 is provided on the pair of electrodes 111.

The source of evaporation 108 held by the pair of electrodes 111 is a means for evaporating substances being evaporated and has a resistance heating system composed of a metal such as tungsten and molybdenum formed into a coil. The metal may be formed into a shape of a boat in place of a coil. Alternatively, it may be a source of evaporation using electron beams which are used in a conventional vacuum evaporation system.

The filament 7, the grid 106a and the grid 106b are disposed between the source of evaporation 108 and the counter electrode 105 in the container 1 in that order from the source of evaporation 108 toward the counter electrode 105.

The first and second grids 106a and 106b have a configuration which allows the substances being evaporated to pass therethrough. In this embodiment, they are composed of a plurality of linear wire electrodes arranged in parallel to each other with an equal space therebetween.

An AC power source 120 for heating is connected to the pair of electrodes 111 which support the source of evaporation 108, and the pair of electrodes 11 which support the filament 7 are connected to a DC power source 122.

The positive electrode of a DC power source 121 is connected to the electrode 112 which supports the grid 106a, and the negative electrode thereof is connected to the electrode 9. Therefore, the grid 106a has a positive potential relative to the potential of the counter electrode 105.

The electrode 113 which supports the grid 106b is connected to the positive electrode of a DC power source 123, and the negative electrode side thereof is connected to the electrode 9. Therefore, the grid 106b also has a positive potential relative to the potential of the counter electrode 105. The voltages of the power sources 121 and 123 are set so that the potential of the grid 106b is lower than that of the grid 106a. The electrode 113 which supports the grid 106b may be connected to the negative electrode of the DC power source 123 or directly grounded not through the power source 123 so that the potential of the grid 106b is lower than that of the grid 106a. The negative electrode of the power source 122 may be grounded, and an AC power source may be used in place of the power source 122. The grounding shown in FIG. 2 is not necessarily required. Actually, various operating switches are provided as a part of electrical conducting means and by operating these switches the film forming process is executed, but these switches are omitted here.

A thin film is formed in the following way.

Figure 2:
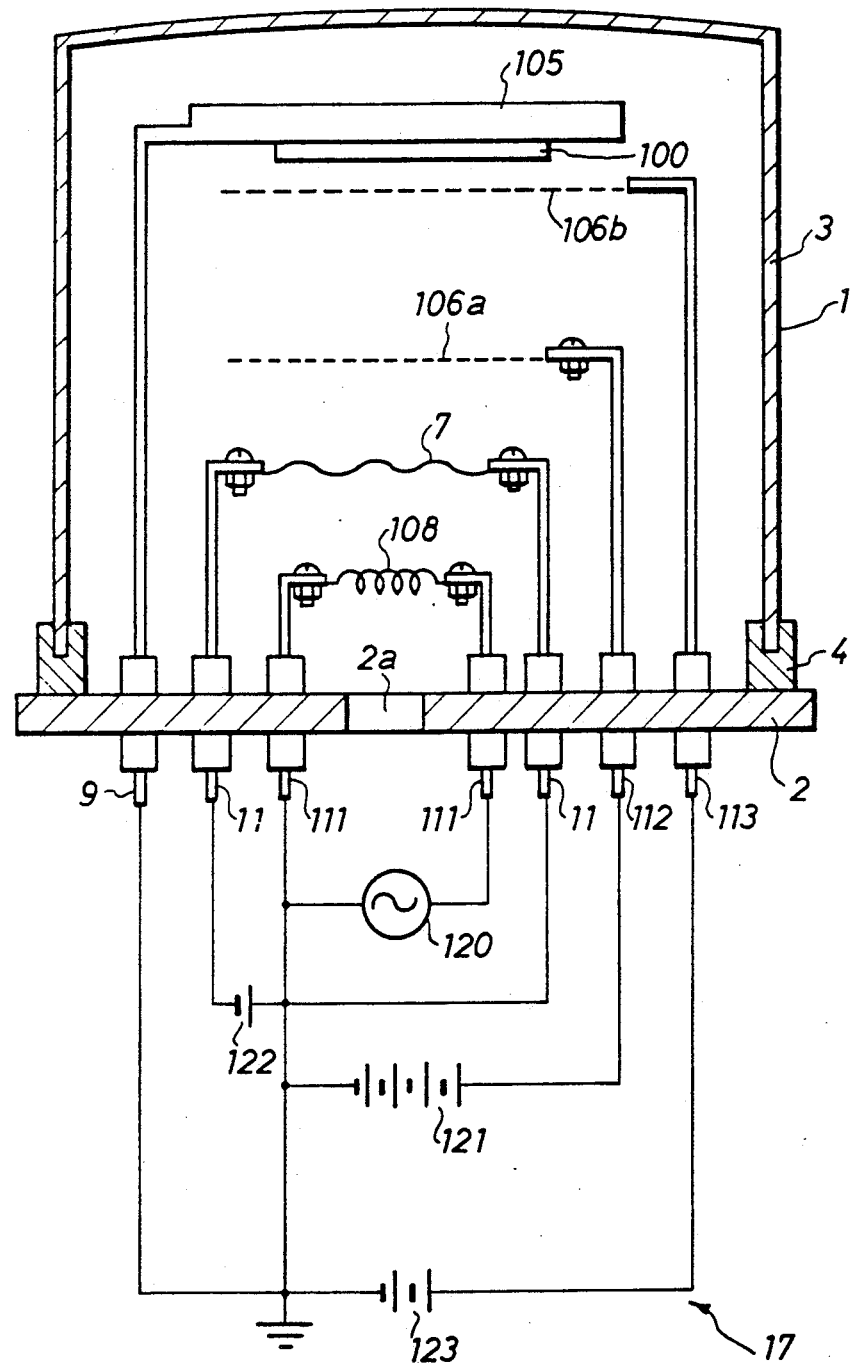
FIG. 2 is a schematic view of a second embodiment of the present invention.

A substrate 100 for deposition is held by the counter electrode 105 so as to oppose the source of evaporation 108, as shown in FIG. 2.

The substances being evaporated are held by the source of evaporation 108. The substances being evaporated are selected in accordance with the type of a thin film to be formed. They are, for example, a metal such as aluminum and gold, an oxide, fluoride and sulfide of a metal, and an alloy.

A gas is introduced into the vacuum container 1 in the same way as in the first embodiment.

If the apparatus is operated in this state, the substances being evaporated which are held by the source of evaporation 108 evaporate. The evaporated substances fly dispersively toward the substrate 100 through the grid 106a. The thermions which are emitted from the filament 7 also fly toward the grid 106a while being accelerated by the effect of the electric field formed by the grids 106a and 106b. When the thermions hit on the particles of the flying evaporated substances and the introduced gas particles in the vicinity of the grid 106a, the thermions ionize these flying evaporated substances and gas particles. Thus, plasma is realized in the space in the vicinity of the grid 106a.

The particles of the ionized evaporated substances are accelerated by the effect of the electric field directed from the grid 106a to the grid 106b and hit on the substrate 100 through the grid 106b. Thus, a desired thin film is formed on the substrate 100.

A uniform plasma state is realized in the vicinity of the substrate 100 by the effect of the grid 106b. The plasma state involves a periodic structure which corresponds to the configuration of the grid, but since the grid 106b moves, the plasma state becomes quite uniform relative to the substrate 100. The thin film formed therefore has uniform thickness and uniform physical properties.

Since a thin film is formed by the collision of the ion particles, it has good adhesion with the substrate 100, and good crystallizability and orientation property.

In the second embodiment, since the ionization ratio of the substances being evaporated is very high and stable, it is possible to obtain a thin film having desired physical properties reliably by using various gases and substances being evaporated in the same way as in the first embodiment.

Since the thermions from the filament 7 effectively contribute to the ionization of the evaporated substances and the introduced gas, it is possible to ionize the evaporated substances even in a high vacuum of not more than $10^{-2}$ Pa, so that only a few gas particles are taken into the formed thin film, thereby forming a thin film of high purity. It is also possible to provide a thin film having a very dense structure.

Although the first and second grids are composed of a plurality of linear electrodes arranged in parallel to each other with an equal space therebetween and only the second grid is moved in the second embodiment, the first grid may also be moved in the same way as the second grid.

Figure 3:
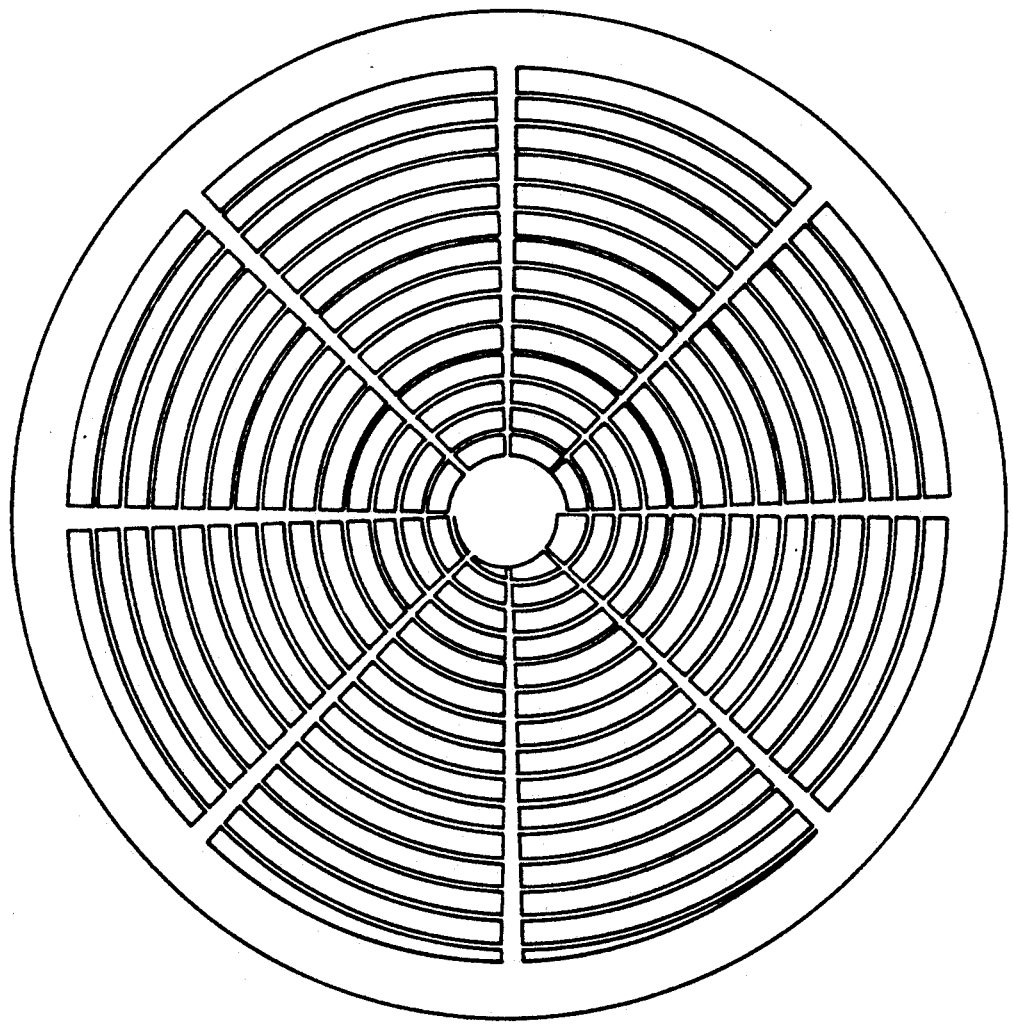
FIG. 3 shows an example of a movable grid in the second embodiment of the present invention.

FIG. 3 shows another example of the configuration of the first grid and/or the second grid.

The configuration of the grid is represented in the polar coordinates $(r, \theta)$, $r$mm and $\theta_{rad}$ by the sum of the region represented by $$r \geq a \cdot \theta / \pi$$

$$r \leq b + a \cdot \theta / \pi$$

and the region represented by $$\theta \geq k \cdot 2\pi / n$$

$$\theta \leq d + k \cdot 2\pi / n$$

wherein $r_0 \leq r \leq r_1$, $k = 0, 1, \ldots n-1$ (n: natural number).

Such a grid may be rotated around the origin of the coordinates by using a rotary motion of a rotating machine during the formation of a thin film.

Figure 4:
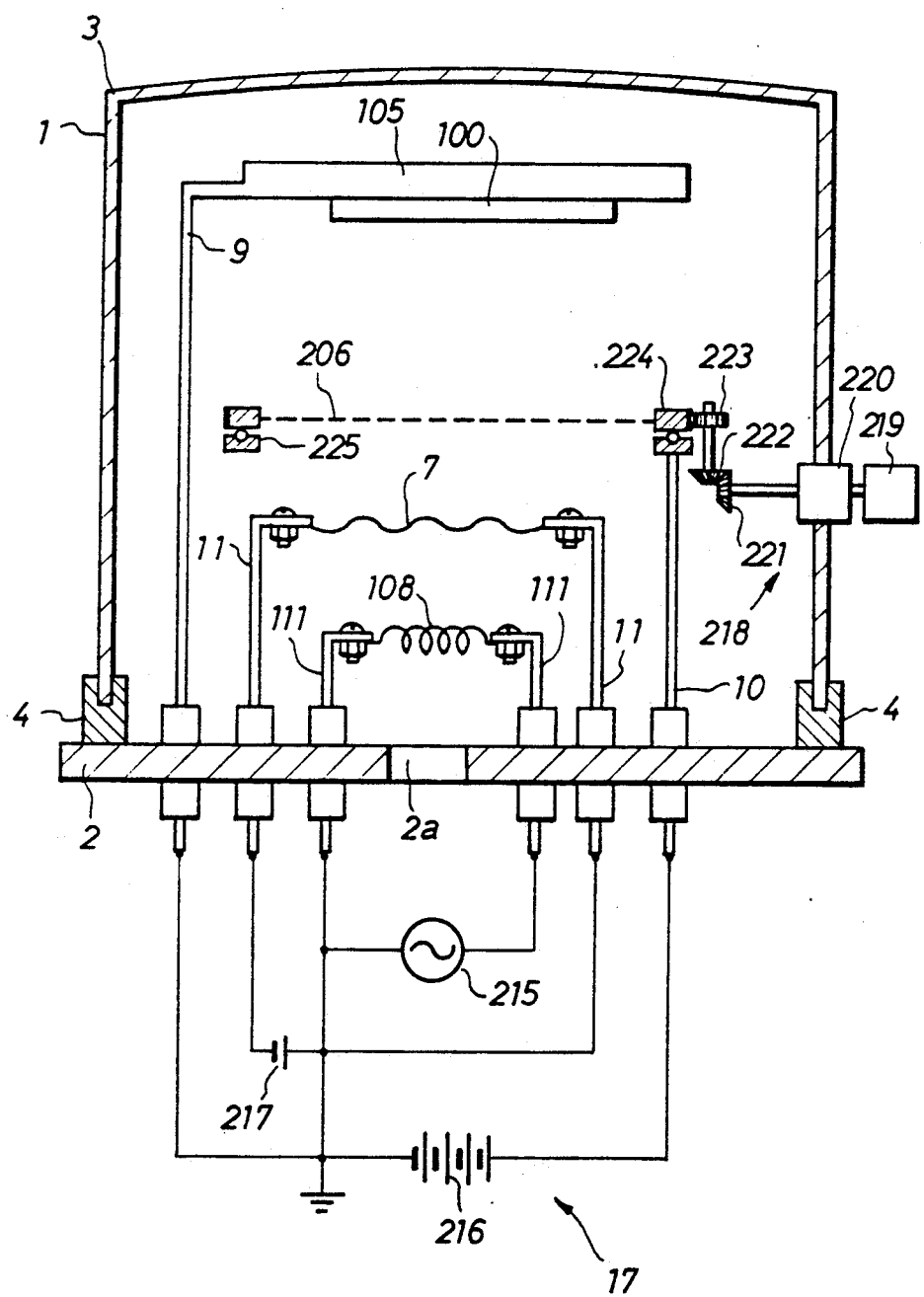
FIG. 4 is a schematic view of a third embodiment of the present invention.

A third embodiment of the present invention will be explained in the following with reference to FIG. 4. The same reference numerals are provided for the elements that are the same as those in the first and second embodiments, and explanation thereof will be omitted.

In the container 1 the counter electrode 105, a grid 206, the filament 7 and the source of evaporation 108 are provided with an appropriate space therebetween in that order from the top to the bottom. These members 105, 206, 7 and 108 are supported in a horizontal state by the electrodes 9, 10, 11 and 111, respectively, which also serve as the supporters. These electrodes 9, 10, 11 and 111 extend to the outside of the vacuum container 1 through the base plate 2 while being kept electrically insulated from the base plate 2. These electrodes 9, 10, 11 and 111 electrically connected and feed the members inside and outside of the container 1 and can constitute the electrically conducting means together with other wiring means. Airtightness is secured at the portions through which the electrodes 9, 10, 11 and 111 extend to the outside of the container 1.

The grid 206 supported by the electrode 10 has a structure having spaces which allow the material vapor to pass therethrough. For example, the grid 206 is reticulate.

The power source means 17 for establishing a predetermined potential relationship between the counter electrode 105, grid 206, filament 7 and source of evaporation 108 is provided outside the container 1 and connected to each member through the electrodes 9, 10, 11 and 111.

The source or evaporation 108 is connected to an AC power source 215 for heating through the electrode 111. A DC power source 216 is provided, and the positive electrode of the DC power source 216 is connected to the grid 206 via the electrode 10 and its negative electrode is connected to the counter electrode 105 via the electrode 9. The grid 206 has a positive potential relative to the potential of the counter electrode 105. Therefore, the electric field between the grid 206 and the counter electrode 105 is directed from the grid 206 to the counter electrode 105. The filament 7 is connected to both ends of a DC power source 217 via the pair of electrodes 11. Although the positive side of the DC power source 217 is grounded in FIG. 4, the negative side may be grounded. In place of the DC power source 217, an AC power source may be used. These power sources 215, 216 and 217 constitute the power source means 17, but the grounding shown in FIG. 4 is not necessarily required.

Actually, the power source means 17 includes various switches for effecting electrical connections and by operating these switches a thin film is formed on the substrate 100, but these switches are omitted here.

In this embodiment, the grid 206 is not provided in a fixed state, but it is connected to a driving mechanism 218 so as to be movable on a predetermined track. The driving mechanism 218 may be any of the known rotation introducing machines, linear motion introducing machines or a combination thereof that allows the grid 206 to move on a track in the container 1 by rotary motion, linear motion or a combination thereof. In this embodiment, the power of a motor 219 disposed outside the container 1 is transmitted to the grid 206 through a rotation introducing device 220, bevel gears 221, 222, 223 and 224 and a bearing 225, thereby rotating the grid 206 on a predetermined track. More specifically, the grid 206 has the gear 224 which is supported in such a manner as to be rotatable in a horizontal plane through the bearing 225 with respect to the electrode 10 (in the electrically connected state) and which interlocks with the gear 223. The driving mechanism 218 is made of a material which can keep electrical insulation between the grid 206 and bell jar 3.

A thin film is formed by using the third embodiment described above in the following way.

The substrate 100 is held by the counter electrode 105 and the substances being evaporated are held by the source of evaporation 108 in the same way as in the second embodiment.

A gas is introduced into the vacuum container 1 in the same way as in the first embodiment.

If the apparatus is operated in this state, the substances being evaporated which are held by the source of evaporation 108 evaporate. The evaporated substances fly dispersively toward the substrate 100 through the grid 206. Thermions are emitted from the filament 7 which is heated by the DC power source 217. The thermions emitted from the filament 7 also fly toward the grid 206 while being accelerated by the action of the electric field between the grid 206 and the counter electrode 105. When the thermions hit on the particles of the flying evaporated substances and the introduced gas in the space in the vicinity of the grid 206, the thermions ionize these particles. Thus, plasma is realized in the space in the vicinity of the grid 206.

The particles of the ionized evaporated substances are accelerated by the effect of the electric field directed from the grid 206 to the counter electrode 105 and hit on the substrate 100 at a high speed. Thus, a desired thin film is formed on the substrate 100. Since a thin film is formed of the ionized evaporated substances, it has good adhesion with the substrate 100, and good crystallizability and orientation property.

During the formation of a thin film, the grid 206 is rotated on a predetermined track by the driving mechanism 218. It is therefore possible to form a thin film having a uniform thickness over the entire surface without producing the unevenness caused by the geometrical pattern of the grid 206. This is because the effect of shielding the evaporated substances by the geometrical pattern of the grid 206 is horizontally averaged by the rotational movement or the like of the grid 206.

As described above, in the third embodiment, since the ionization ratio of the substances being evaporated is very high and stable, it is possible to obtain a thin film having desired physical properties reliably by using various gases and substances being evaporated in the same way as in the first embodiment.

Since the thermions from the filament 7 effectively contribute to the ionization of the evaporated substances and introduced gas, it is possible to ionize the evaporated substances even in a high vacuum of not more than $10^{-2}$ Pa, so that only a few gas particles are taken into the formed thin film, thereby forming a thin film of high purity. It is also possible to provide a thin film having a very dense structure. The film thickness and the resistance of a thin film are made uniform. Thus, an apparatus for forming a thin film according to the third embodiment is very suitable for the formation of semiconductor thin films constituting LSI and IC, etc., thin metal films of high purity used for electrodes, and optical thin films.

In short, an apparatus according to the third embodiment is a completely new apparatus which can realize both the merit of CVD and the merit of PVD, the former being that it is possible to provide a thin film with strong reactivity and the latter being that film formation is executed in a high vacuum which enables the formation of a dense and strong thin film. Since the evaporated substances are ionized and have electrically high energy (the temperatures of electrons and ions), it is possible to realize the film formation which requires reactivity and crystallization without providing heat energy in the form of temperature (reaction temperature and crystallization temperature), thereby enabling film formation at a low temperature. A plastic sheet or the like having a low heat resistance may therefore be used as the substrate 100. In addition, since the grid 206 is rotated on a predetermined track in the vacuum container during the formation of a thin film, the geometrical pattern drawn by the grid produces the effect of shading the substances uniformly at each portion of the substrate, thereby greatly decreasing the unevennes in the film thickness. Therefore, the third embodiment can improve the productivity of IC,LSI, etc. and the quality of an optical thin film so that it is applicable to the field of semiconductors and optical fields.

Various changes and modifications may be effected within the spirit and scope of the present invention as described herein above, not limited by the embodiments.

What is claimed is:

1. An apparatus for forming a thin film comprising;
   a vacuum container evacuated to a high vacuum and receiving a gas for vapor deposition therein;
   generation means for generating a vapor of a material for vapor deposition and introducing said vapor into said container;
   a counter electrode disposed within said container and holding a substrate to be vapor-deposited such that said substrate opposes said generation means;
   a first grid disposed between said generation means and said electrode for allowing said vapor to pass therethrough and accelerating said vapor, and electrical potential of said first grid set positive relatively to an electrical potential of said electrode;
   a second grid disposed between said first grid and said electrode in the vicinity of said electrode for allowing said vapor to pass therethrough and accelerating said vapor, an electrical potential of said second grid set negative relatively to said potential of said first grid;
   a filament disposed between said first gird and said generation means for emitting thermions to ionize said vapor; and
   moving means for moving at least said first grid and said second grid with respect to said electrode on a predetermined track in order to form the thin film having uniform thickness on said substrate.

2. An apparatus according to claim 1, wherein said gas comprises an active gas, an inert gas or a mixture of said active gas and said inert gas.

3. An apparatus according to claim 1, wherein said generation means comprises a source of evaporation of either a resistance heating means or an electron beam for evaporating a substance as said vapor within said container.

4. An apparatus according to claim 1, wherein said generation means comprises an evaporation injector for injecting an evaporated substance as said vapor within said container.

5. An apparatus for forming a thin film comprising:
   a vacuum container evacuated to high vacuum and receiving a gas for vapor deposition therein,
   generation means for generating a vapor of a material for vapor deposition and introducing said vapor into said container, a counter electrode disposed within said container and holding a substrate to be vapor-deposited such that said substrate opposes said generating means, a grid disposed between said generation means and said electrode for allowing said vapor to pass therethrough and accelerating said vapor, an electrical potential of said grid set positive relatively to an electrical potential of said electrode, a filament disposed between said grid and said generation means for emitting thermions to ionize said vapor; and moving means for moving said grid with respect to said electrode on a predetermined track in order to form the thin film having a uniform thickness on said substrate.

6. An apparatus according to claim 5, wherein said gas comprises an active gas, an inert gas or a mixture of said active gas and inert gas.

7. An apparatus according to claim 5, wherein said generation means comprises a source of evaporation of either a resistance heating means or an electron beam for evaporating a substance as said vapor within said container.

8. An apparatus according to claim 5, wherein said generation means comprises an evaporation injector for injecting an evaporated substance as said vapor within said container.

* * * * *